(12) United States Patent
Demura et al.

(10) Patent No.: US 11,784,040 B2
(45) Date of Patent: Oct. 10, 2023

(54) SUBSTRATE TREATMENT DEVICE

(71) Applicant: Shibaura Mechatronics Corporation, Yokohama (JP)

(72) Inventors: Kensuke Demura, Yokohama (JP); Daisuke Matsushima, Yokohama (JP); Masaya Kamiya, Yokohama (JP)

(73) Assignee: SHIBAURA MECHATRONICS CORPORATION, Kanagawa (JP)

( * ) Notice: Subject to any disclaimer, the term of this patent is extended or adjusted under 35 U.S.C. 154(b) by 418 days.

(21) Appl. No.: 17/181,264

(22) Filed: Feb. 22, 2021

(65) Prior Publication Data

US 2021/0265159 A1 Aug. 26, 2021

(30) Foreign Application Priority Data

Feb. 25, 2020 (JP) .................. 2020-029816
Dec. 15, 2020 (JP) .................. 2020-207685

(51) Int. Cl.
*H01L 21/02* (2006.01)
*B08B 7/00* (2006.01)
*H01L 21/67* (2006.01)

(52) U.S. Cl.
CPC ...... *H01L 21/02057* (2013.01); *B08B 7/0092* (2013.01); *H01L 21/02052* (2013.01); *H01L 21/67023* (2013.01)

(58) Field of Classification Search
CPC ............................... H01L 21/02057
See application file for complete search history.

(56) References Cited

U.S. PATENT DOCUMENTS

| 2013/0068257 A1 | 3/2013 | Tomita et al. |
| 2018/0047559 A1 | 2/2018 | Kamiya et al. |
| 2020/0078833 A1 | 3/2020 | Takai et al. |

FOREIGN PATENT DOCUMENTS

| JP | 2018-026436 A | 2/2018 |
| JP | 2020-043128 A | 3/2020 |

*Primary Examiner* — Jason Y Ko
(74) *Attorney, Agent, or Firm* — PEARNE & GORDON LLP

(57) ABSTRACT

According to one embodiment, a substrate treatment device includes a placement stand configured to rotate a substrate, a cooling part configured to supply a cooling gas into a space between the placement stand and the substrate, a liquid supplier configured to supply a liquid on a surface of the substrate opposite to the placement stand, and a controller controlling a rotation speed of the substrate, a flow rate of the cooling gas, or a supply amount of the liquid. The controller sets the liquid on the surface of the substrate to be in a supercooled state, forms a frozen film by freezing the liquid in the super cooled state, and causes crack to generate in the frozen film by decreasing a temperature of the frozen film.

20 Claims, 6 Drawing Sheets

SUBSTRATE TREATMENT DEVICE

CROSS-REFERENCE TO RELATED APPLICATIONS

This application is based upon and claims the benefit of priority from Japanese Patent Application No. 2020-029816, filed on Feb. 25, 2020, and No. 2020-207685, filed on Dec. 15, 2020; the entire contents of which are incorporated herein by reference.

FIELD

Embodiments described herein relate generally to a substrate treatment device.

BACKGROUND

A freeze-cleaning method has been proposed as a method for removing contaminations such as particles adhering to the surface of a substrate such as an imprint template, a photolithography mask, and a semiconductor wafer.

In the freeze-cleaning method, for example, when pure water is used as the liquid used for cleaning, the pure water and cooling gas are first supplied to the surface of the rotated substrate. Next, the supply of pure water is stopped, and a part of the supplied pure water is discharged to form a water film on the surface of the substrate. The water film is frozen by the cooling gas supplied to the substrate. When the water film freezes and an ice film is formed, contaminations such as particles are taken into the ice film and separated from the surface of the substrate. Next, pure water is supplied to the ice film to melt the ice film, and contaminations are removed from the surface of the substrate together with the pure water.

According to a freeze-cleaning method, contaminations adhered to a surface of a substrate can be effectively removed. However, recently, a removal ratio of the contaminations is desired to be further improved.

DETAILED DESCRIPTION

Figure 1:
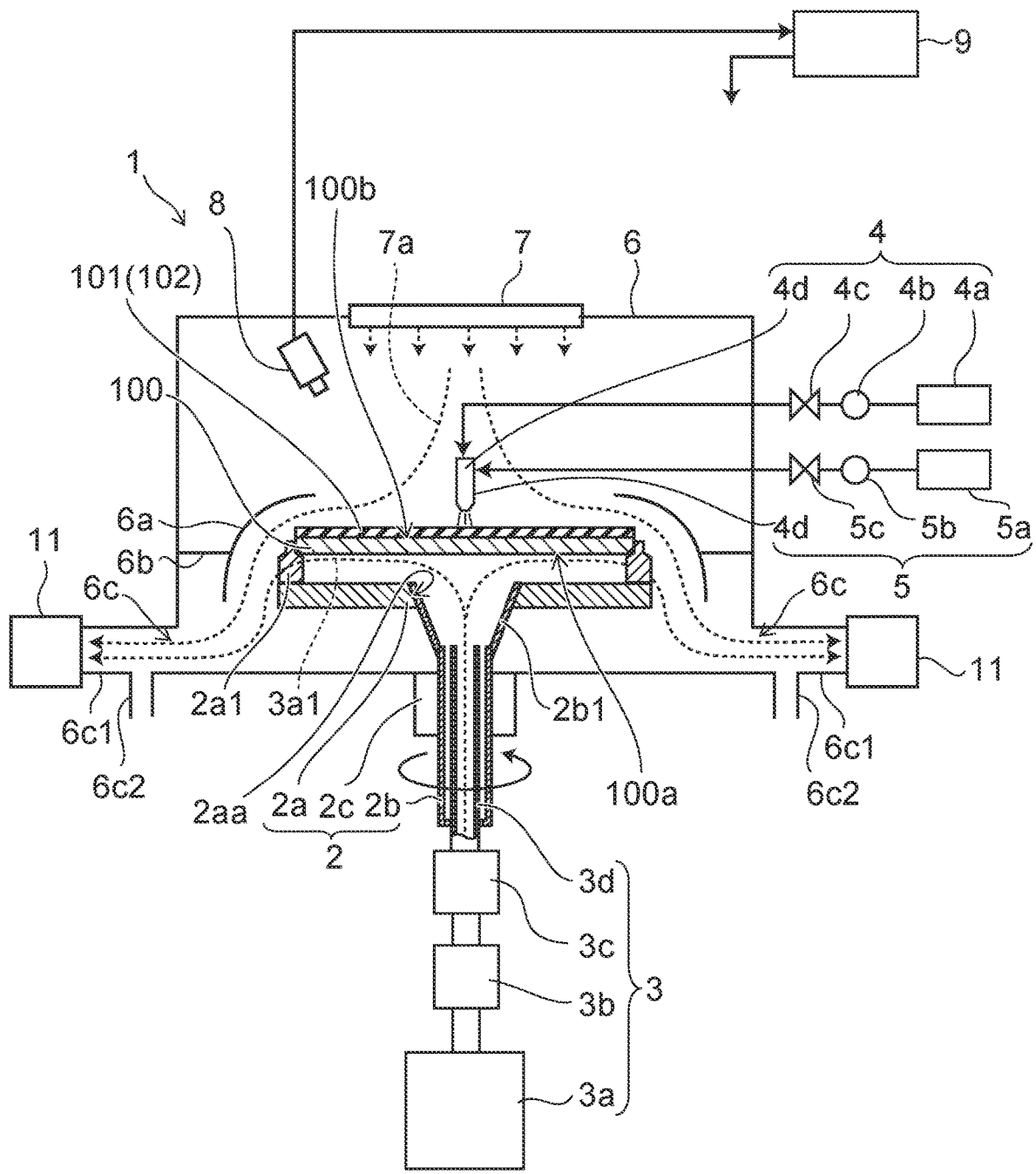
FIG. 1 is a schematic view for illustrating a substrate treatment device according to the embodiment.

According to one embodiment, a substrate treatment device includes a placement stand configured to rotate a substrate, a cooling part configured to supply a cooling gas into a space between the placement stand and the substrate, a liquid supplier configured to supply a liquid on a surface of the substrate opposite to the placement stand, and a controller controlling a rotation speed of the substrate, a flow rate of the cooling gas, or a supply amount of the liquid. The controller sets the liquid on the surface of the substrate to be in a supercooled state, forms a frozen film by freezing the liquid in the super cooled state, and causes crack to generate in the frozen film by decreasing a temperature of the frozen film.

Various embodiments are described below with reference to the accompanying drawings.

In the specification and drawings, similar components are marked with like reference numerals, and a detailed description is omitted as appropriate.

The substrate 100 illustrated below can be, for example, a semiconductor wafer, an imprint template, a photolithography mask, a plate-like body used for MEMS (Micro Electro Mechanical Systems), or the like.

Although the substrate 100 may have uneven portions that are patterns on the surface, the substrate treatment device 1 according to the embodiment can be preferably used for cleaning a substrate (for example, a so-called bulk substrate) before the unevenness are formed. However, the application of the substrate treatment device 1 is not limited to cleaning a bulk substrate.

Further, in the following, as an example, a case where the substrate 100 is a mask for photolithography will be described. When the substrate 100 is a mask for photolithography, the planar shape of the substrate 100 can be a substantially quadrangle.

FIG. 1 is a schematic view for illustrating the substrate treatment device 1 according to the embodiment.

As shown in FIG. 1, the substrate treatment device 1 includes a placement part 2, a cooling part 3, a first liquid supplier 4, a second liquid supplier 5, a housing 6, a blower part 7, a detector 8, and a controller 9, and an exhaust part 11. The placement part 2 includes a placement stand 2a, a rotation axis 2b, and a drive part 2c.

The placement table 2a is rotatably provided inside the housing 6. The placement table 2a has a plate shape. Multiple support portions 2a1 for supporting the substrate 100 are provided on one major surface of the placement table 2a. When the substrate 100 is supported by the multiple support portions 2a1, the surface 100b (surface on which cleaning is performed) of the substrate 100 faces a direction opposite to the placement table 2a side.

The edges of the back surface 100a of the substrate 100 come into contact with the multiple support portions 2a1. The portion of the support portion 2a1 that comes into contact with the edge of the back surface 100a of the substrate 100 can be a tapered surface or an inclined surface. If the portion of the support portion 2a1 that contacts the edge of the back surface 100a of the substrate 100 is a tapered surface, the support portion 2a1 and the edge of the back surface 100a of the substrate 100 can be brought into point contact. If the portion of the support portion 2a1 that contacts the edge of the back surface 100a of the substrate 100 is an inclined surface, the support portion 2a1 and the edge of the back surface 100a of the substrate 100 can be brought into line contact. If the support portion 2a1 and the edge of the back surface 100a of the substrate 100 are in point contact or line contact, it is possible to suppress the substrate 100 from being soiled or damaged.

Further, a hole 2aa piercing the thickness direction of the placement table 2a is provided in the central portion of the placement table 2a.

One end of the rotating shaft 2b is fitted into the hole 2aa of the placement table 2a. The other end of the rotating shaft 2b is provided on the outside of the housing 6. The rotating shaft 2b is connected to the drive part 2c outside the housing 6.

The rotating shaft 2b has a tubular shape. A blowout portion 2b1 is provided at the end of the rotating shaft 2b on the placement table 2a side. The blowout portion 2b1 is open to the surface of the placement table 2a where multiple supporting portions 2a1 are provided. The opening-side end of the blowout portion 2b1 is connected to the inner wall of the hole 2aa. The opening of the blowout portion 2b1 faces the back surface 100a of the substrate 100 placed on the placement table 2a.

The blowout portion 2b1 has a shape in which the cross-sectional area increases toward the placement table 2a side (opening side). Therefore, the cross-sectional area of the hole inside the blowout portion 2b1 increases toward the placement table 2a side (opening side). Although the case where the blowout portion 2b1 is provided at the tip of the rotating shaft 2b has been illustrated, the blowout portion 2b1 can also be provided at the tip of the cooling nozzle 3d described later. Further, the hole 2aa of the placement table 2a can be used as the blowing portion 2b1.

If the blowing portion 2b1 is provided, the released cooling gas 3a1 can be supplied to a wider area of the back surface 100a of the substrate 100. In addition, the release rate of the cooling gas 3a1 can be reduced. Therefore, it is possible to suppress the substrate 100 from being partially cooled or the substrate 100 from becoming too fast. As a result, it becomes easy to generate a supercooled state of the liquid 101, which will be described later. Further, the supercooled state of the liquid 101 can be generated in a wider region of the surface 100b of the substrate 100. Therefore, the removal ratio of contaminations can be improved.

A cooling nozzle 3d is attached to the end of the rotating shaft 2b on the side opposite to the placement table 2a side. A rotating shaft seal (not shown) is provided between the end of the rotating shaft 2b on the side opposite to the placement table 2a side and the cooling nozzle 3d. Therefore, the end of the rotating shaft 2b on the side opposite to the placement table 2a side is sealed so as to be airtight.

The drive part 2c is provided outside the housing 6. The drive part 2c is connected to the rotating shaft 2b. The drive part 2c can have a rotating device such as a motor. The rotational force of the drive part 2c is transmitted to the placement table 2a via the rotation shaft 2b. Therefore, the drive part 2c can rotate the placement table 2a and, in addition, the substrate 100 placed on the placement table 2a.

Further, the drive part 2c can not only start and stop the rotation but also change the rotation speed (rotation speed). The drive part 2c may be provided with a control motor such as a servo motor, for example.

The cooling part 3 supplies the cooling gas 3a1 to the space between the placement table 2a and the back surface 100a of the substrate 100. The cooling part 3 includes a coolant part 3a, a filter 3b, a flow rate controller 3c, and a cooling nozzle 3d. The coolant part 3a, the filter 3b, and the flow rate controller 3c are provided outside the housing 6.

The coolant part 3a stores the coolant and generates the cooling gas 3a1. The cooling liquid is a liquefied cooling gas 3a1. The cooling gas 3a1 is not particularly limited as long as it is a gas that does not easily react with the material of the substrate 100. The cooling gas 3a1 can be, for example, an inert gas such as nitrogen gas, helium gas, or argon gas.

In this case, the cooling time of the substrate 100 can be shortened by using a gas having a high specific heat. For example, if helium gas is used, the cooling time of the substrate 100 can be shortened. Further, if nitrogen gas is used, the processing cost of the substrate 100 can be reduced.

The coolant part 3a includes a tank for storing the coolant and a vaporizer for vaporizing the coolant stored in the tank. The tank is provided with a cooling device for maintaining the temperature of the coolant. The vaporizer raises the temperature of the coolant to generate the cooling gas 3a1 from the coolant. For the vaporizer, for example, the outside air temperature can be used, or heating with a heat medium can be used. The temperature of the cooling gas 3a1 may be a temperature equal to or lower than the freezing point of the liquid 101, and can be, for example, −170° C.

Although the case where the coolant part 3a generates the cooling gas 3a1 by vaporizing the coolant stored in the tank is illustrated, it is also possible to cool the nitrogen gas or the like with a chiller or the like to obtain the cooling gas 3a1. By doing so, the coolant portion can be simplified.

The filter 3b is connected to the coolant part 3a via a pipe. The filter 3b suppresses the outflow of contaminations such as particles included in the coolant to the substrate 100 side.

The flow rate controller 3c is connected to the filter 3b via a pipe. The flow rate controller 3c controls the flow rate of the cooling gas 3a1. The flow rate controller 3c can be, for example, an MFC (Mass Flow Controller) or the like. Further, the flow rate controller 3c may indirectly control the flow rate of the cooling gas 3a1 by controlling the supply pressure of the cooling gas 3a1. In this case, the flow rate controller 3c can be, for example, an APC (Auto Pressure Controller).

The temperature of the cooling gas 3a1 generated from the coolant in the coolant part 3a is substantially a predetermined temperature. Therefore, the flow rate controller 3c can control the flow rate of the cooling gas 3a1 to control the temperature of the substrate 100 and, in addition, the temperature of the liquid 101 on the surface 100b of the substrate 100. In this case, by controlling the flow rate of the cooling gas 3a1 by the flow rate controller 3c, the supercooled state of the liquid 101 can be generated in a supercooling process described later.

The cooling nozzle 3d has a tubular shape. One end of the cooling nozzle 3d is connected to the flow controller 3c. The other end of the cooling nozzle 3d is provided inside the rotating shaft 2b. The other end of the cooling nozzle 3d is located near the end of the blowout portion 2b1 opposite to the placement table 2a side (opening side).

The cooling nozzle 3d supplies the cooling gas 3a1 whose flow rate is controlled by the flow rate controller 3c to the substrate 100. The cooling gas 3a1 discharged from the cooling nozzle 3d is directly supplied to the back surface 100a of the substrate 100 via the blowout portion 2b1.

The first liquid supplier 4 supplies the liquid 101 to the surface 100b of the substrate 100. In the freezing process (solid-liquid phase) described later, when the liquid 101 changes to a solid, the volume changes, so that a pressure wave is generated. It is considered that the contaminations adhering to the surface 100b of the substrate 100 are separated by this pressure wave. Therefore, the liquid 101 is not particularly limited as long as it does not easily react with the material of the substrate 100. The liquid 101 in the supercooled state also has a property that a change in density due to non-uniform temperature of the liquid film, the presence of contaminations such as particles, vibration, and the like are the starting points of freezing. That is, some percentage of the starting point of freezing also has the property of becoming contaminations.

If the liquid 101 is a liquid whose volume increases when it is frozen, it is considered that the contaminations adhering to the surface of the substrate 100 can be separated by utilizing the physical force accompanying the volume increase. Therefore, it is preferable that the liquid 101 is a liquid that does not easily react with the material of the substrate 100 and whose volume increases when frozen. For example, the liquid 101 can be water (for example, pure water, ultrapure water, etc.), liquid including water as a main component, or the like.

The liquid including water as a main component can be, for example, a mixed solution of water and alcohol, a mixed solution of water and an acidic solution, a mixed solution of water and an alkaline solution, and the like.

Since the surface tension can be reduced by using a mixed solution of water and alcohol, it becomes easy to supply the liquid 101 to the inside of the fine uneven portion formed on the surface 100b of the substrate 100.

If a mixed solution of water and an acidic solution is used, contaminations such as particles and resist residues adhering to the surface of the substrate 100 can be dissolved. For example, a mixed solution of water and sulfuric acid can dissolve contaminations made of resist or metal.

If a mixed solution of water and an alkaline solution is used, the zeta potential can be lowered, so that the contaminations separated from the surface 100b of the substrate 100 can be suppressed from reattaching to the surface 100b of the substrate 100.

However, if the amount of components other than water is too large, it becomes difficult to utilize the physical force associated with the increase in volume, so that the removal ratio of contaminations may decrease. Therefore, the concentration of components other than water is preferably 5 wt % or more and 30 wt % or less.

Further, the gas can be dissolved in the liquid 101. The gas can be, for example, carbon dioxide gas, ozone gas, hydrogen gas, or the like. If carbon dioxide gas is dissolved in the liquid 101, the conductivity of the liquid 101 can be increased, so that the substrate 100 can be statically eliminated and antistatic can be prevented. If ozone gas is dissolved in the liquid 101, contaminations made of organic substances can be dissolved.

The first liquid supplier 4 includes a liquid storage part 4a, a supplier 4b, a flow rate controller 4c, and a liquid nozzle 4d. The liquid storage part 4a, the supplier 4b, and the flow rate controller 4c are provided outside the housing 6.

The liquid storage part 4a stores the liquid 101 described above. The liquid 101 is stored in the liquid storage part 4a at a temperature higher than the freezing point. The liquid 101 is stored at room temperature (20° C.), for example.

The supplier 4b is connected to the liquid storage part 4a via a pipe. The supplier 4b supplies the liquid 101 stored in the liquid storage part 4a toward the liquid nozzle 4d. The supplier 4b can be, for example, a pump having resistance to the liquid 101. Although the case where the supplier 4b is a pump has been illustrated, the supplier 4b is not limited to the pump. For example, the supplier 4b may supply gas to the inside of the liquid storage part 4a and pump the liquid 101 stored in the liquid storage part 4a.

The flow rate controller 4c is connected to the supplier 4b via a pipe. The flow rate controller 4c controls the flow rate of the liquid 101 supplied by the supplier 4b. The flow rate controller 4c can be, for example, a flow rate control valve. In addition, the flow rate controller 4c can also start and stop the supply of the liquid 101.

The liquid nozzle 4d is provided inside the housing 6. The liquid nozzle 4d has a tubular shape. One end of the liquid nozzle 4d is connected to the flow controller 4c via a pipe. The other end of the liquid nozzle 4d faces the surface 100b of the substrate 100 placed on the placement table 2a.

Therefore, the liquid 101 discharged from the liquid nozzle 4d is supplied to the surface 100b of the substrate 100.

The other end of the liquid nozzle 4d (the discharge port of the liquid 101) is located substantially in the center of the surface 100b of the substrate 100. The liquid 101 discharged from the liquid nozzle 4d spreads from substantially the center of the surface 100b of the substrate 100, and a liquid film having a substantially constant thickness is formed on the surface 100b of the substrate 100. In the following, the film of the liquid 101 formed on the surface 100b of the substrate 100 will be referred to as a liquid film.

The second liquid supplier 5 supplies the liquid 102 to the surface 100b of the substrate 100. The second liquid supplier 5 includes a liquid storage part 5a, a supplier 5b, a flow rate controller 5c, and a liquid nozzle 4d.

The liquid 102 can be used in the thawing process described later. Therefore, the liquid 102 is not particularly limited as long as it does not easily react with the material of the substrate 100 and does not easily remain on the surface 100b of the substrate 100 in the drying process described later. The liquid 102 can be, for example, water (for example, pure water, ultrapure water, etc.), a mixed solution of water and alcohol, or the like.

The liquid storage part 5a can be the same as the liquid storage part 4a described above. The supplier 5b can be the same as the supplier 4b described above. The flow rate controller 5c can be the same as the flow rate controller 4c described above.

When the liquid 102 and the liquid 101 are the same, the second liquid supplier 5 can be omitted. Further, although the case where the liquid nozzle 4d is also used is illustrated, a liquid nozzle for discharging the liquid 101 and a liquid nozzle for discharging the liquid 102 may be provided separately.

Further, the temperature of the liquid 102 can be higher than the freezing point of the liquid 101. Further, the temperature of the liquid 102 can be set to a temperature at which the frozen liquid 101 can be thawed. The temperature of the liquid 102 can be, for example, about room temperature (20° C.).

When the second liquid supplier 5 is omitted, the first liquid supplier 4 is used in the thawing process. That is, the liquid 101 is used. The temperature of the liquid 101 can also be a temperature at which the frozen liquid 101 can be thawed. The temperature of the liquid 101 can be, for example, about room temperature (20° C.).

The housing 6 has a box shape. A cover 6a is provided inside the housing 6. The cover 6a receives the liquids 101 and 102 supplied to the substrate 100 and discharged to the outside of the substrate 100 by rotating the substrate 100. The cover 6a has a tubular shape. The vicinity of the end of the cover 6a opposite to the placement table 2a side (near the upper end of the cover 6a) is bent toward the center of the cover 6a. Therefore, it is possible to easily capture the liquids 101 and 102 scattered above the substrate 100.

Further, a partition plate 6b is provided inside the housing 6. The partition plate 6b is provided between the outer surface of the cover 6a and the inner surface of the housing 6.

Multiple discharge ports 6c are provided on the bottom surface side of the housing 6. In the case of the housing 6 illustrated in FIG. 1, two discharge ports 6c are provided. The used cooling gas 3a1, air 7a, liquid 101, and liquid 102 are discharged from the discharge port 6c to the outside of the housing 6. An exhaust pipe 6c1 is connected to the discharge port 6c, and an exhaust part (pump) 11 for exhausting the used cooling gas 3a1 and air 7a is connected to the exhaust pipe 6c1. Further, a discharge pipe 6c2 for discharging the liquids 101 and 102 is connected to the discharge port 6c.

The discharge port 6c is provided below the substrate 100. Therefore, the cooling gas 3a1 is exhausted from the discharge port 6c to create a downflow flow. As a result, it is possible to prevent the particles from soaring.

In a plan view, the multiple discharge ports 6c are provided so as to be symmetrical with respect to the center of the housing 6. In this way, the exhaust direction of the cooling gas 3a1 becomes symmetrical with respect to the center of the housing 6. If the exhaust directions of the cooling gas 3a1 are symmetrical, the exhaust of the cooling gas 3a1 becomes smooth.

The blower part 7 is provided on the ceiling surface of the housing 6. The blower part 7 may be provided on the side surface of the housing 6 as long as it is on the ceiling side. The blower part 7 can include a blower such as a fan and a filter. The filter can be, for example, a HEPA filter (High Efficiency Particulate Air Filter) or the like.

The blower part 7 supplies air 7a (outside air) to the space between the partition plate 6b and the ceiling of the housing 6. Therefore, the pressure in the space between the partition plate 6b and the ceiling of the housing 6 becomes higher than the external pressure. As a result, it becomes easy to guide the air 7a supplied by the blower part 7 to the discharge port 6c. In addition, it is possible to prevent contaminations such as particles from entering the inside of the housing 6 from the discharge port 6c.

Further, the blower part 7 supplies air at room temperature 7a to the surface 100b of the substrate 100. Therefore, the blower part 7 can change the temperature of the liquids 101 and 102 on the substrate 100 by controlling the supply amount of the air 7a. Therefore, the blower part 7 can control the supercooled state of the liquid 101 in the supercooling process described later, promote the thawing of the liquid 101 in the thawing process, or promote the drying of the liquid 102 in the drying process.

The detector 8 is provided in the space between the partition plate 6b and the ceiling of the housing 6. The detector 8 detects the temperature of the liquid film or the frozen film in which the liquid 101 is frozen. In this case, the detector 8 can be, for example, a radiation thermometer, a thermoviewer, a thermocouple, or a resistance temperature detector. Further, the detector 8 may detect the thickness of the liquid film and the surface position of the frozen film. In this case, the detector 8 can be, for example, a laser displacement meter, an ultrasonic displacement meter, or the like. Further, the detector 8 may be an image sensor or the like that detects the surface state of the liquid film or the surface state of the frozen film.

The detected temperature, thickness, and surface state of the liquid film can be used to control the supercooled state of the liquid 101 in the supercooling process described later. Note that controlling the supercooled state means controlling the curve of the temperature change of the liquid 101 in the supercooled state so that the liquid 101 is not frozen due to rapid cooling, that is, the supercooled state is maintained.

In addition, the detected temperature, thickness, and surface state of the frozen film can be used to detect "occurrence of cracks" in the freezing process (solid phase) described later. For example, when the detector 8 detects the temperature, "cracking" can be indirectly detected from the temperature of the frozen film in the freezing process (solid phase) described later. When the detector 8 detects the thickness, "cracking" can be detected from the change in the surface position of the frozen film in the freezing process (solid phase) described later. When the detector 8 detects the surface state, "cracking" can be detected from the surface state of the frozen film in the freezing process (solid phase) described later.

The controller 9 controls the operation of each element provided in the substrate treatment device 1. The controller 9 can include, for example, a computational element such as a CPU (Central Processing Unit) and a memory element such as a semiconductor memory. The controller 9 can be, for example, a computer. A control program for controlling the operation of each element provided in the substrate treatment device 1 can be stored in the memory element. The computational element controls the operation of each element provided in the substrate treatment device 1 by using a control program stored in the memory element, data input by the operator, data from the detector 8, and the like.

For example, the cooling rate of the liquid 101 correlates with the thickness of the liquid film. For example, the thinner the liquid film, the faster the cooling rate of the liquid 101. On the contrary, the thicker the liquid film, the slower the cooling rate of the liquid 101. Therefore, the controller 9 can control the flow rate of the cooling gas 3a1 and the cooling rate of the liquid 101 based on the thickness of the liquid 101 (thickness of the liquid film) detected by the detector 8. The temperature and cooling rate of the liquid 101 are controlled when the supercooled state of the liquid 101 is controlled in the supercooling process described later. Therefore, for example, the controller 9 can control the rotation of the substrate 100, the flow rate of the cooling gas 3a1, and the supply amount of the liquid 101.

For example, the controller 9 causes the liquid 101 on the surface 100b of the substrate 100 to be in a supercooled state, and freezes the supercooled liquid 101 to form a frozen film, and decreases the temperature of the frozen film to occur cracks in the frozen film.

Next, the operation of the substrate processing treatment 1 will be illustrated.

Figure 2:
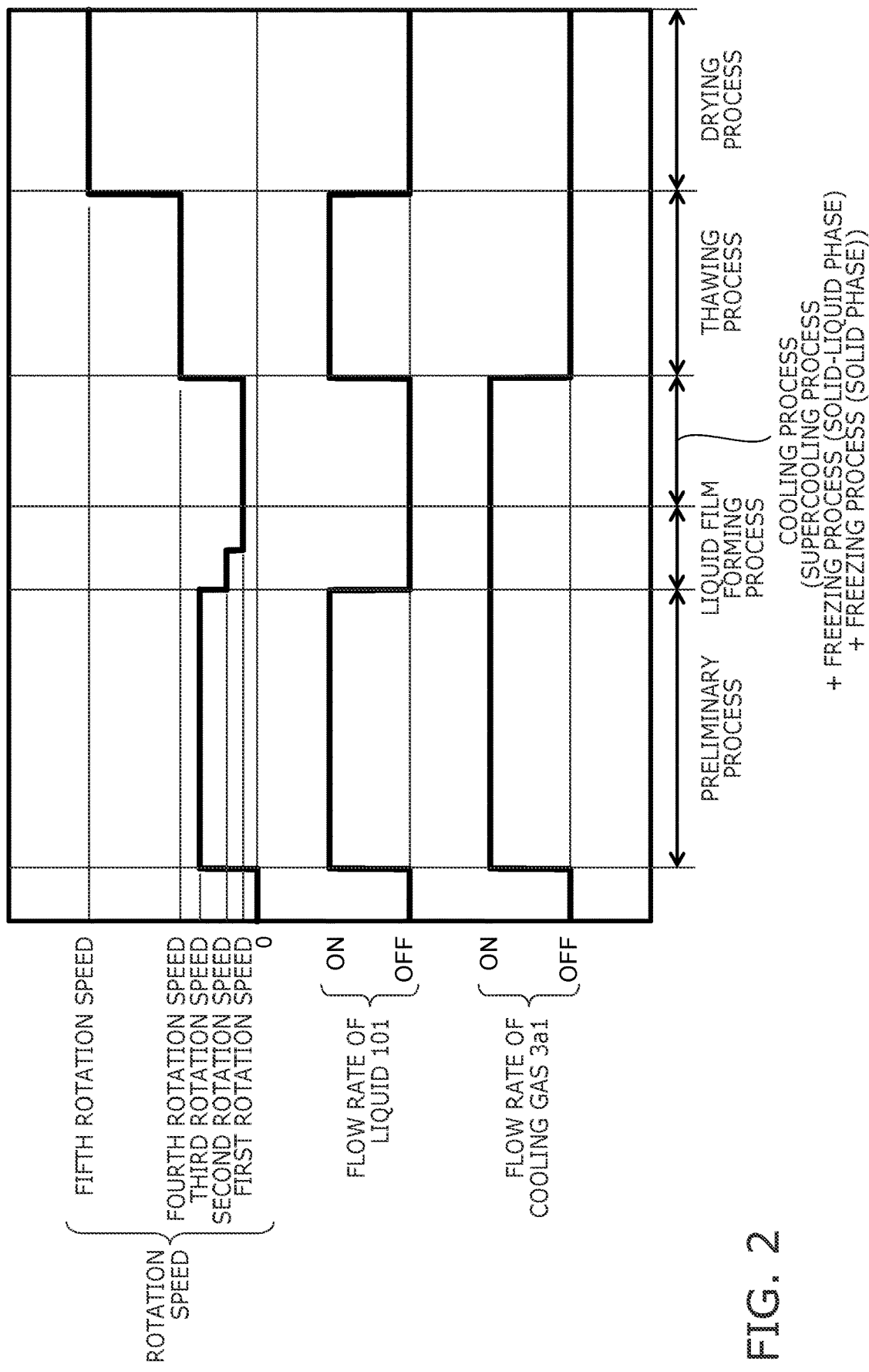
FIG. 2 is a timing chart for illustrating the operation of the substrate treatment device.

FIG. 2 is a timing chart for illustrating the operation of the substrate treatment device 1.

Figure 3:
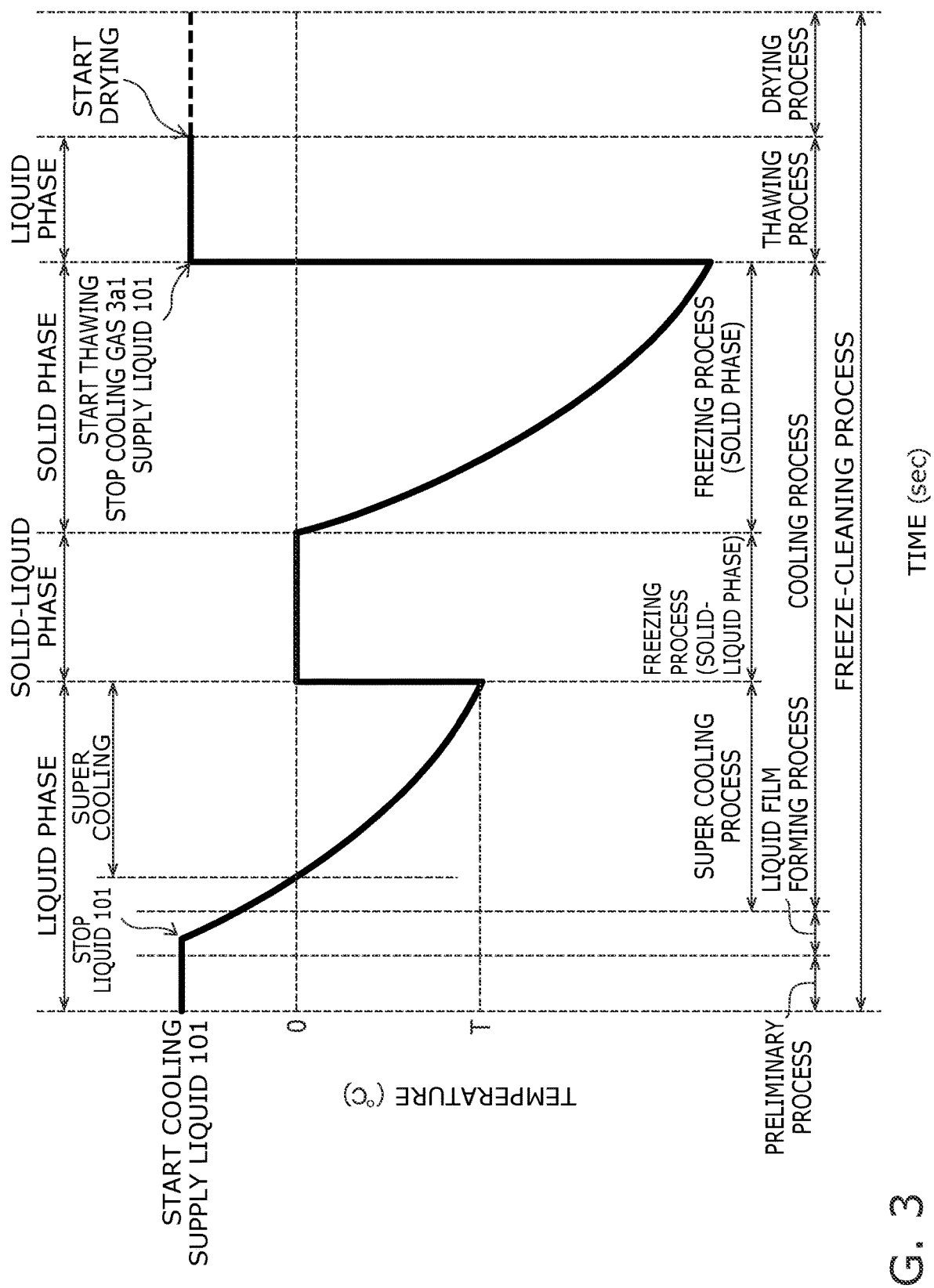
FIG. 3 is a graph for illustrating a temperature change of liquid supplied to the substrate in a freeze-cleaning process.

FIG. 3 is a graph for illustrating a temperature change of the liquid 101 supplied to the substrate 100 in the freeze-cleaning process.

FIGS. 2 and 3 show a case where the substrate 100 is a 6025 quartz (Qz) substrate (152 mm×152 mm×6.35 mm) and the liquid 101 is pure water.

First, the substrate 100 is carried into the inside of the housing 6 through a carry-in/carry-out port (not shown) of the housing 6. The carried-in substrate 100 is placed and supported on multiple support portions 2a1 of the placement table 2a.

After the substrate 100 is supported by the placement stand 2a, a freeze-cleaning process including a preliminary process, a liquid film forming process, a cooling process, a thawing process, and a drying process is performed as shown in FIG. 2.

First, the preliminary process is performed as shown in FIGS. 2 and 3. In the preliminary process, the controller 9 controls the supplier 4b and the flow rate controller 4c to supply the liquid 101 at a predetermined flow rate to the surface 100b of the substrate 100. Further, the controller 9 controls the flow rate controller 3c to supply the cooling gas 3a1 having a predetermined flow rate to the back surface 100a of the substrate 100. Further, the controller 9 controls the drive part 2c to rotate the substrate 100 at the third rotation speed.

Here, when the atmosphere inside the housing 6 is cooled by the supply of the cooling gas 3a1 by the cooling part 3, frost including dust in the atmosphere may adhere to the substrate 100 and cause contamination. In the preliminary process, since the liquid 101 is continuously supplied to the surface 100b of the substrate 100, it is possible to prevent the frost from adhering to the surface 100b of the substrate 100 while uniformly cooling the substrate 100.

For example, in the case of the one illustrated in FIG. 2, the rotation speed of the substrate 100 can be, for example, about 50 rpm to 500 rpm as the third rotation speed. The flow rate of the liquid 101 can be about 0.1 L/min to LO L/min. The flow rate of the cooling gas 3a1 can be about 40 NL/min to 200 NL/min. In addition, the process time of the preliminary process can be set to about 1800 seconds. The process time of the preliminary process may be any time as long as the in-plane temperature of the substrate 100 becomes substantially uniform, and can be obtained by conducting experiments or simulations in advance.

The temperature of the liquid film in the preliminary process is substantially the same as the temperature of the supplied liquid 101 because the liquid 101 is in a flowing state. For example, when the temperature of the supplied liquid 101 is about room temperature (20° C.), the temperature of the liquid film is about room temperature (20° C.).

Next, the liquid film forming process is executed as shown in FIGS. 2 and 3. When the liquid film forming process is performed, the thickness (predetermined thickness) of the liquid film is set to correspond to a rotation speed (second rotation speed) at which a high removal ratio can be obtained. The second rotation speed is, for example, 50 rpm to 100 rpm. That is, the controller 9 rotates the substrate 100 at the same rotation speed as the rotation speed during the preliminary process or less than the rotation speed during the preliminary process. Then, as illustrated in FIG. 2, the supply of the liquid 101 supplied in the preliminary process is stopped, and the substrate 100 is rotated at the second rotation speed until the thickness reaches a predetermined value. Whether or not the thickness has reached a predetermined value may be confirmed by measuring the thickness of the liquid film by the detector 8. The thickness of the liquid film may be measured by the detector 8 and the time for reaching the predetermined thickness may be calculated in advance, and the second rotation speed may be maintained during the time for reaching the predetermined thickness. After that, the rotation speed of the substrate 100 is set to such a rotation speed (first rotation speed) that the liquid film of the liquid 101 supplied onto the substrate 100 from the supplier 4b is maintained at a uniform thickness. The first rotation speed may be any rotation speed that can suppress the thickness variation of the liquid film due to centrifugal force, and may be, for example, 0 rpm to 50 rpm or less. During the liquid film forming process, the flow rate of the cooling gas 3a1 is maintained at the same supply amount as in the preliminary process. As described above, the in-plane temperature of the substrate 100 is made substantially uniform in the preliminary process. In the liquid film forming process, the state of the substrate 100 can be maintained in a state where the in-plane temperature is substantially uniform by maintaining the flow rate of the cooling gas 3a1 at the same supply amount as in the preliminary process.

Further, when it is desired to increase the predetermined thickness, the third rotation speed can be changed to the first rotation speed instead of changing from the third rotation speed to the second rotation speed. In this case, the first rotation speed is preferably a rotation speed close to 0 rpm. In particular, when the rotation of the substrate 100 is stopped, it is possible to further suppress the variation in the thickness of the liquid film due to the centrifugal force.

The number of rotations may also be the first rotation number from the preliminary process. Further, the third rotation speed may be slower than the first rotation speed.

Further, when shifting from the preliminary process to the liquid film forming process, the liquid 101 supplied during the preliminary process may be discharged by rotating the substrate 100 at a high speed. In this case, after discharging the liquid 101, the rotation speed of the substrate 100 may be less than the rotation speed (50 rpm) at which a liquid film having a uniform thickness is maintained, or after the rotation of the substrate 100 is stopped, a predetermined amount of liquid 101 may be supplied to the substrate 100. By doing so, a liquid film having a predetermined thickness can be easily formed.

As will be described later, the thickness of the liquid film formed in the liquid film forming process (thickness of the liquid film when performing the cooling process) can be about 300 μm to 1300 μm. For example, the controller 9 controls the supply amount of the liquid 101 and the rotation speed of the substrate 100 to make the thickness of the liquid film on the surface 100b of the substrate 100 about 300 μm to 1300 μm.

Details regarding the thickness of the liquid film will be described later.

Next, a cooling process is performed as shown in FIGS. 2 and 3. In the embodiment, the period in the cooling process before the freezing of the liquid 101 in the supercooled state starts is called a the "supercooling process", and the period from the start of the freezing of the liquid 101 in the supercooled state till the complete completion is called a "freezing process (solid-liquid phase)". The period until the frozen liquid 101 is further cooled to cause cracks is called a "freezing process (solid phase)". In the supercooling process, only the liquid 101 is present on the surface 100b of the substrate 100. In the freezing process (solid-liquid phase), the liquid 101 and the frozen liquid 101 are on the surface 100b of the substrate 100. In the freezing process (solid phase), only the frozen liquid 101 is present on the surface 100b of the substrate 100. The solid-liquid phase means a state in which the liquid 101 and the frozen liquid 101 are present as a whole. Further, a state in which the liquid 101 is only frozen is referred to as a frozen film 101a.

First, in the supercooling process, the temperature of the liquid film on the substrate 100 is further lowered than the temperature of the liquid film in the liquid film forming process due to the cooling gas 3a1 continuously supplied to the back surface 100a of the substrate 100, resulting in the supercooled state.

Here, if the cooling rate of the liquid 101 becomes too high, the liquid 101 does not become a supercooled state and freezes immediately. Therefore, the controller 9 controls at least one of the rotation speed of the substrate 100, the flow rate of the cooling gas 3a1, and the supply amount of the liquid 101, so that the liquid 101 on the surface 100b of the substrate 100 becomes supercooled.

The control conditions under which the liquid 101 is in the supercooled state are affected by the size of the substrate 100, the viscosity of the liquid 101, the specific heat of the cooling gas 3a1, and the like. Therefore, it is preferable to appropriately determine the control conditions for the liquid 101 to be in the supercooled state by conducting an experiment or a simulation.

In the supercooled state, freezing of the liquid 101 starts due to, for example, the temperature of the liquid film, the presence of contaminations such as particles and bubbles, and vibration. For example, in the presence of contaminations such as particles, freezing of the liquid 101 starts when the temperature T of the liquid 101 becomes not lower than −35° C. and not higher than −20° C. Further, freezing of the liquid 101 can be started by applying vibration to the liquid 101 by varying the rotation of the substrate 100.

When freezing of the liquid 101 in the supercooled state starts, the process shifts from the supercooling process to the freezing process (solid-liquid phase). In the freezing process (solid-liquid phase), the liquid 101 and the frozen liquid 101 are as a whole on the surface 100b of the substrate 100. As described above, the supercooled liquid 101 has a property that some percentage at the starting point of freezing becomes a contamination. It is considered that contaminations adhering to the surface 100b of the substrate 100 are separated by this property, the pressure wave accompanying the volume change when the liquid 101 changes to a solid, the physical force accompanying the volume increase, and the like. Therefore, the contaminations adhering to the surface 100b of the substrate 100 can be separated by the pressure wave or the physical force generated when a part of the liquid 101 freezes.

When the liquid film on the surface 100b of the substrate 100 is completely frozen, the process shifts from the freezing process (solid-liquid phase) to the freezing process (solid phase). In the freezing process (solid phase), the temperature of the frozen film 101a on the surface 100b of the substrate 100 is further lowered. Here, the liquid 101 mainly includes water. Therefore, when the liquid film on the surface 100b of the substrate 100 is completely frozen to form the frozen film 101a and the temperature of the frozen film 101a is further lowered, the volume of the frozen film 101a is reduced and stress is generated in the frozen film 101a.

In this case, for example, when the temperature of the frozen film 101a becomes −50° C. or lower, the frozen film 101a cracks. When the frozen film 101a is cracked, the contamination 103 adhering to the surface 100b of the substrate 100 is separated from the surface 100b of the substrate 100. The mechanism by which the contamination 103 is separated from the surface 100b of the substrate 100 is not always clear, but can be considered as follows.

Figure 4A:
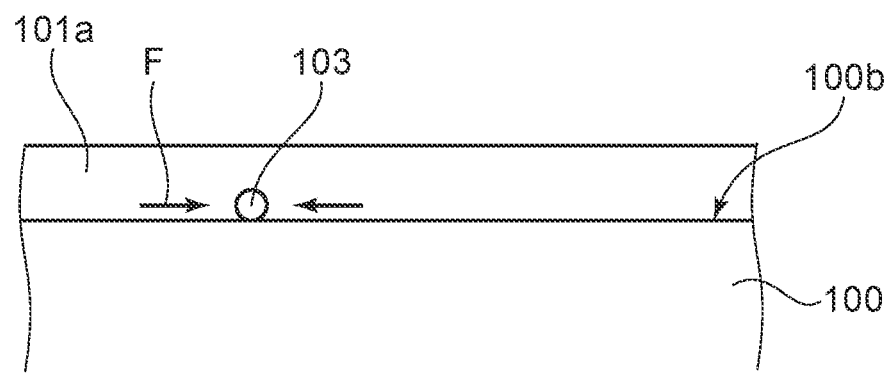
FIGS. 4A and 4B are schematic views for illustrating a separation mechanism of contaminations.
Figure 4B:
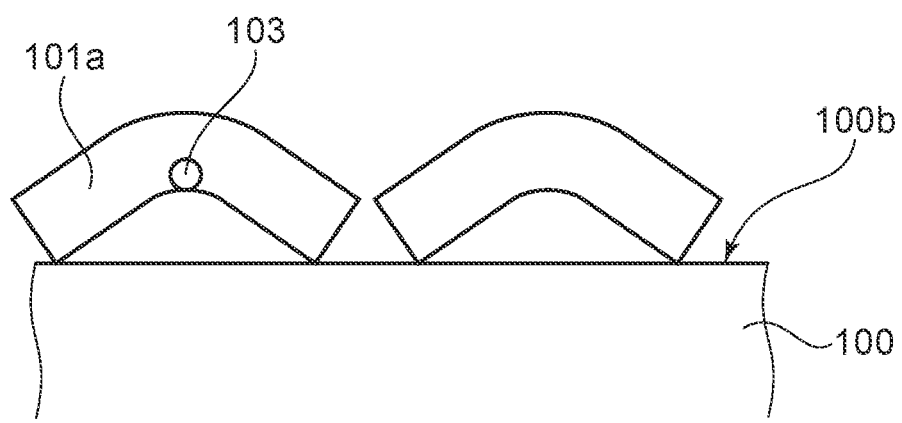

FIGS. 4A and 4B are schematic views for illustrating the separation mechanism of the contamination 103.

As shown in FIG. 4A, when the temperature of the frozen film 101a decreases in the freezing process (solid phase), the stress F corresponding to the difference between the coefficient of thermal expansion of the frozen film 101a and the coefficient of thermal expansion of the substrate 100 occurs.

Then, as shown in FIG. 4B, when the temperature of the frozen film 101a further decreases (for example, becomes −50° C. or lower), the frozen film 101a cannot withstand the increased stress F and cracks are generated in the frozen film 101a. In this case, in general, the coefficient of thermal expansion of the frozen film 101a including water as a main component is larger than the coefficient of thermal expansion of the substrate 100, so that the frozen film 101a faces the outside as shown in FIG. 4B, and deforms into a convex shape and cracks occur.

Since the contamination 103 is incorporated into the frozen film 101a, when the frozen film 101a is deformed in a convex shape toward the outside (when cracks occur), the contaminations 103 are separated from the surface 100b of the substrate 100 as shown in FIG. 4 (b).

Further, according to the knowledge obtained by the present inventor, it has been found that increasing the thickness of the liquid film when performing the supercooling process improves the removal ratio of the contamination 103 in the freezing process (solid phase). It is probably because the stress F increased by increasing the thickness of the liquid film, and the bending of the frozen film 101a when it was deformed convexly toward the outside became large. In this case, if the removal ratio of the contamination 103 is improved in the freezing process (solid phase), the number of executions can be reduced when the freeze-cleaning process is repeated multiply. Therefore, it is possible to shorten the time required for the freeze-cleaning work and to improve the productivity.

Figure 5:
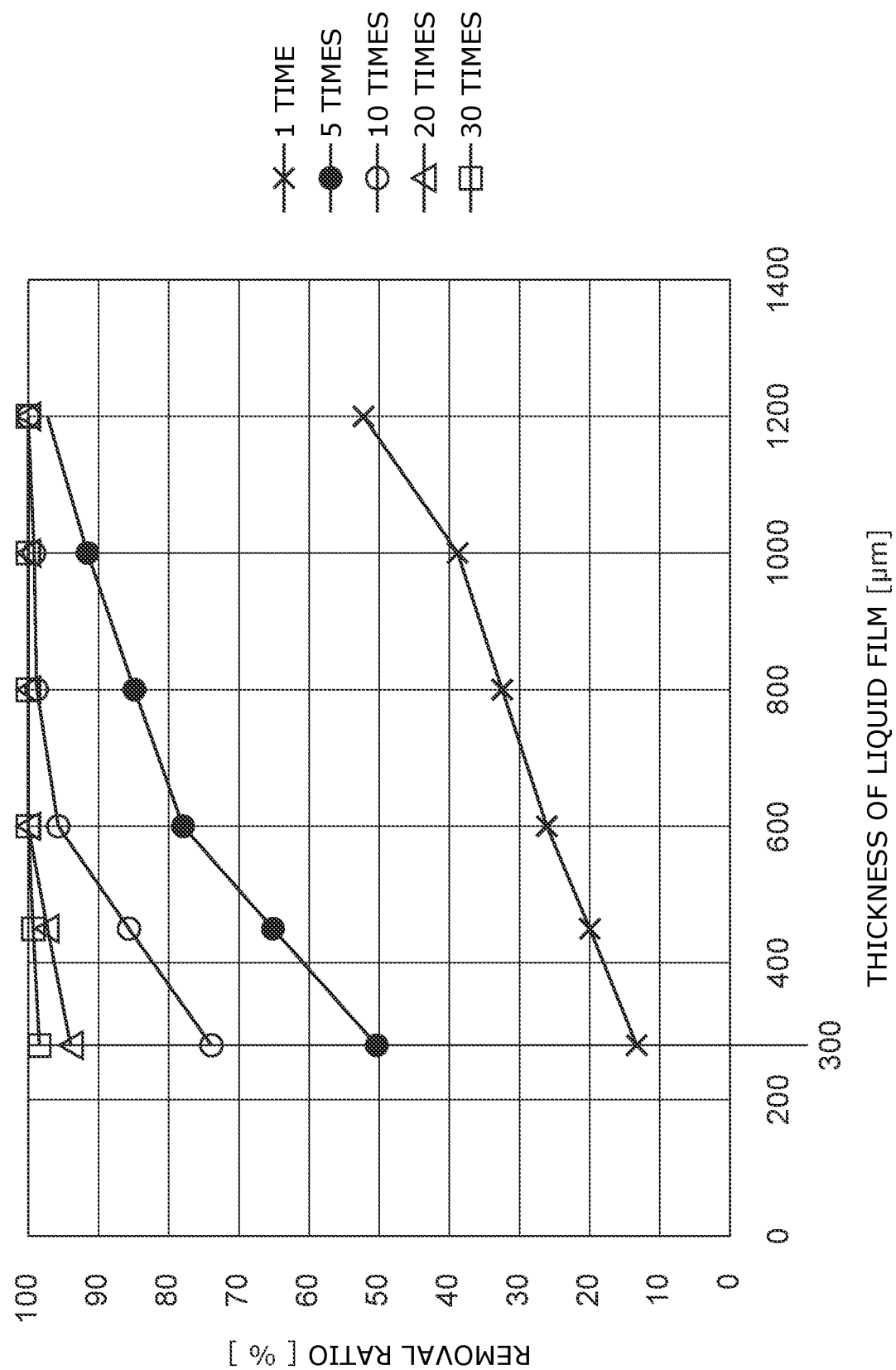
FIG. 5 is a graph for illustrating a relationship between a thickness of a liquid film and number of times of repetitions of the freeze-cleaning process.

FIG. 5 is a graph for illustrating the relationship between the thickness of the liquid film and the number of repetitions of the freeze-cleaning process. The number of times in the figure is the number of times that the freeze-cleaning process is repeated. In addition, the target removal ratio of contaminations on the substrate 100 was set to 90%. The target removal ratio (predetermined removal ratio) may be set so that the yield in cleaning the substrate 100 becomes an allowable value. Further, in order to eliminate the influence of centrifugal force, the first rotation speed was set to 0 rpm. Therefore, the thickness at which the liquid film can be uniformly formed on the surface 100b of the substrate 100 is 300 µm.

As can be seen from FIG. 5, when the number of repetitions is 20 or more, the removal ratio of the contamination 103 can be improved to 90% or more by setting the thickness of the liquid film when performing the supercooling process to 300 µm or more. Further, when the number of repetitions is 10 or more, if the thickness of the liquid film is 600 µm or more, the removal ratio of the contamination 103 can be improved to 90% or more. Further, when the number of repetitions is 5 or more, if the thickness of the liquid film is 1000 µm or more, the removal ratio of the contamination 103 can be improved to 90% or more.

By the way, the thickness of the liquid film can be increased to about 1300 µm because it is affected by the surface tension of the liquid 101 and the like. However, if the thickness is increased to about 1300 µm, a part of the liquid film may spill from the substrate 100 even at a rotation speed of 50 rpm or less. Therefore, the maximum thickness of the liquid film can be about 1200 µm. Therefore, the thickness of the liquid film when the supercooling process is performed is preferably not less than 300 µm and not more than 1200 µm when the number of repetitions is 20 or more, and more preferable to be not less than 600 µm and not more than 1200 µm when the number of repetitions is 10 or more.

When the thickness of the liquid film is not less than 300 µm and not more than 1200 µm, the removal ratio of the contamination 103 is improved to 90% or more by repeating the freeze-cleaning process 20 times. When forming a liquid film having a thickness in the above range, if the rotation speed is 50 rpm or less, the liquid 101 is not shaken off by centrifugal force, and the liquid film can be easily formed. Further, if the thickness of the liquid film is not less than 600 µm and not more than 1200 µm, the number of executions can be reduced to not less than 10 times and less than 20 times. Therefore, it is possible to shorten the time required for the freeze-cleaning work and to improve the productivity. In order to further reduce the number of executions to not less than 5 and less than 10 times, the thickness of the liquid film is preferably not less than 1000 µm and not more than 1200 µm.

The number of executions of the freeze-cleaning process is input by the operator via an input/output screen (not shown). Alternatively, the substrate treatment device 1 may read a mark such as a barcode or a QR code (registered trademark) attached to a case for housing the substrate.

The result of FIG. 5 is the data when thawing is performed at about −50° C. where cracks occur. According to the knowledge obtained by the inventors, it has been found that when the frozen film 101a is continuously cooled even if the frozen film 101a is cracked, the removal ratio when the freeze-cleaning process is performed once exceeds 90%. That is, if the processing time of the freezing process (solid phase) is set long, a high removal ratio can be obtained even in one freezing process. Furthermore, it was also found that when the processing time of the freezing process (solid phase) was set long, a high removal ratio could be obtained regardless of the thickness of the liquid film.

It is not clear why the removal ratio is improved regardless of the thickness of the liquid film by setting a long processing time in the freezing process (solid phase). However, by carrying out the processing time of the freezing process (solid phase) for a predetermined time or longer, a high removal ratio can be obtained even in one freezing process.

Next, after the frozen film 101a is cracked, the thawing process is executed as shown in FIGS. 2 and 3. The occurrence of cracks can be detected by the detector 8. For example, when the detector 8 detects the temperature, in the freezing process (solid phase), "the occurrence of cracks" can be indirectly detected from the temperature of the frozen film 101a (for example, −50° C. or lower). When the detector 8 detects the thickness, "cracking" can be detected from the change in the surface position of the frozen film 101a in the freezing process (solid phase). When the detector 8 is an image sensor, it is possible to detect "occurrence of cracks" by image processing in the freezing process (solid phase).

In addition, what illustrated in FIGS. 2 and 3 is a case where the liquid 101 and the liquid 102 are the same liquid. Therefore, it is described as liquid 101 in FIGS. 2 and 3. In the thawing process, the controller 9 controls the supplier 4b and the flow rate controller 4c to supply the liquid 101 at a predetermined flow rate to the surface 100b of the substrate 100. When the liquid 101 and the liquid 102 are different, the controller 9 controls the supplier 5b and the flow rate controller 5c to supply the liquid 102 at a predetermined flow rate to the surface 100b of the substrate 100.

Further, the controller 9 controls the flow rate controller 3c to stop the supply of the cooling gas 3a1. Further, the controller 9 controls the drive part 2c to increase the rotation speed of the substrate 100 to the fourth rotation speed. The fourth rotation speed can be, for example, about 200 rpm to 700 rpm. If the rotation of the substrate 100 becomes faster, the liquid 101 and the frozen liquid 101 can be shaken off by centrifugal force. Therefore, the liquid 101 and the frozen liquid 101 can be discharged from the surface 100b of the substrate 100. At this time, the contaminations 103 separated from the surface 100b of the substrate 100 are also discharged together with the liquid 101 and the frozen liquid 101.

The supply amount of the liquid 101 or the liquid 102 is not particularly limited as long as it can be thawed. Further, the fourth rotation speed of the substrate 100 is not particularly limited as long as the liquid 101, the frozen liquid 101, and the contaminations 103 can be discharged.

Next, the drying process is performed as shown in FIGS. 2 and 3. In the drying process, the controller 9 controls the supplier 4b and the flow rate controller 4c to stop the supply of the liquid 101. When the liquid 101 and the liquid 102 are different liquids, the controller 9 controls the supplier 5b and the flow rate controller 5c to stop the supply of the liquid 102.

Further, the controller 9 controls the drive part 2c to increase the rotation speed of the substrate 100 to a fifth rotation speed faster than the fourth rotation speed. If the rotation of the substrate 100 becomes faster, the substrate 100 can be dried quickly. The fifth rotation speed of the substrate 100 is not particularly limited as long as it can be dried.

The substrate 100 that has been freeze-cleaned is carried out of the housing 6 through a carry-in/carry-out port (not shown) of the housing 6.

By doing the above, one freeze-cleaning process can be performed.

As described above, the freeze-cleaning process is performed multiply. Therefore, if the next freeze-cleaning process is carried out, the supply of the cooling gas 3a1 is maintained even in the thawing process. By doing so, the same state as in the preliminary process can be generated. Therefore, the preliminary process and the drying process in the next freeze-cleaning process can be omitted.

Therefore, when the freeze-cleaning process is repeated multiply, the freeze-cleaning process should include at least the supercooling process of overcooling the liquid 101 on the surface 101b of the substrate 100, the freezing process (solid-liquid phase) in which the liquid 101 and the frozen liquid 101 are present, the freezing process (solid phase) and the thawing process. Freezing process (solid phase) in which a frozen film 101a formed by completely freezing the liquid 101 is cooled to cause cracks in the frozen film 101a.

In the substrate treatment device 1 according to the embodiment, it is separated not only by the properties of the supercooled liquid in which freezing starts from a contamination, but also by the action of the pressure wave accompanying the volume change when the liquid 101 changes to a solid, the physical force accompanying the volume increase, and the like the contaminant 103 adhering to the surface of the substrate 100 in the freezing step (solid-liquid phase).

Further, in the freezing process (solid phase), the frozen film 101a is cracked, so that the frozen film 101a in which the contamination 103 is incorporated is deformed in a convex shape toward the outside, thereby the contamination 103 adhering to the surface of the substrate 100 is separated.

That is, according to the substrate treatment device 1, the contamination 103 is separated by different mechanisms in the freezing process (solid-liquid phase) and the freezing process (solid phase). Therefore, the removal ratio of the contamination 103 can be improved.

Further, in the substrate treatment device 1 according to the embodiment, the first rotation speed is set so that the thickness of the liquid film can be suppressed from fluctuating due to centrifugal force in the cooling process. When the second rotation speed resulting in a predetermined thickness is maintained in the cooling process, the centrifugal force due to the second rotation speed is applied to the liquid 101 on the surface 100b of the substrate 100. The centrifugal force increases as the distance from the center of rotation increases. Therefore, the liquid 101 collects on the outer edge of the substrate 100. At this time, forces such as viscosity and surface tension of the liquid 101 act on the liquid 101 on the outer edge of the substrate 100, so that the thickness of the liquid film on the outer edge of the substrate 100 becomes thicker. That is, the thickness of the liquid film in the central portion of the substrate 100 is relatively thin.

As described above, when the thickness of the liquid film in performing the supercooling process is increased, the removal ratio of the contamination 103 is improved in the freezing process (solid phase). That is, in the cooling process, if the second rotation speed resulting in the predetermined thickness is maintained, the removal ratio of the central portion of the substrate 100 may decrease.

Further, in the embodiment, the cooling gas 3a1 is supplied from the blow out portion 2b1 in the central portion of the placement stand 2a. Therefore, the temperature of the outer edge of the substrate 100 is higher than the temperature of the central portion of the substrate 100. As described above, when the second rotation speed is maintained in the cooling process, the thickness of the liquid film on the outer edge of the substrate 100 becomes thicker. Therefore, the liquid film on the outer edge of the substrate 100, which is thicker than the liquid film on the central portion of the substrate 100, is cooled in a state where the cooling efficiency is inferior to that on the central portion of the substrate 100. Therefore, the cooling rate of the liquid film on the outer edge of the substrate 100 is lower than that of the central portion of the substrate 100. That is, the occurrence of cracks at the outer edge of the substrate 100 is delayed.

The freezing process (solid phase) ends the process when it is confirmed that cracks have occurred in all the planes of the substrate 100. Therefore, if the freezing process (solid phase) is performed in a state where the thickness of the liquid film varies due to centrifugal force, the processing time of the freezing process (solid phase) becomes long.

That is, if the freezing process (solid phase) is performed in a state where the thickness of the liquid film varies due to centrifugal force, the processing time may become long and the expected removal ratio may not be obtained. Therefore, in the cooling process, it is preferable to set the first rotation speed that can suppress the variation in the thickness of the liquid film due to the centrifugal force.

Further, when the rotation of the substrate 100 is stopped (set to 0 rpm), the thickness of the liquid film in the central portion of the substrate 100 becomes thicker than the thickness of the liquid film on the outer edge of the substrate 100. The gradient of the thickness of the liquid film is opposite to the temperature gradient of the substrate 100 described above. That is, the cooling rate is constant at the central portion and the outer edge portion of the substrate 100. When the cooling rate is constant at the central portion and the outer edge portion of the substrate 100, cracks occur at the same time at the central portion and the outer edge portion of the substrate 100, so that the processing time of the freezing process (solid phase) can be suppressed from becoming long. Therefore, it is preferable to stop the rotation of the substrate 100 (set to 0 rpm).

Further, when the number of repetitions of the freeze-cleaning process is 20 or more, if the thickness of the liquid film when performing the freeze-cleaning process is not less than 300 μm and not more than 1200 μm, the removal ratio of the contamination 103 can be effectively improved to 90% or more while improving the productivity. Further, when the number of repetitions of the freeze-cleaning process is 5 or more, if the thickness of the liquid film is not less than 1000 μm and not more than 1200 μm, the removal ratio of the contamination 103 can be improved effectively to 90% or more while further improving the productivity.

Figure 6:
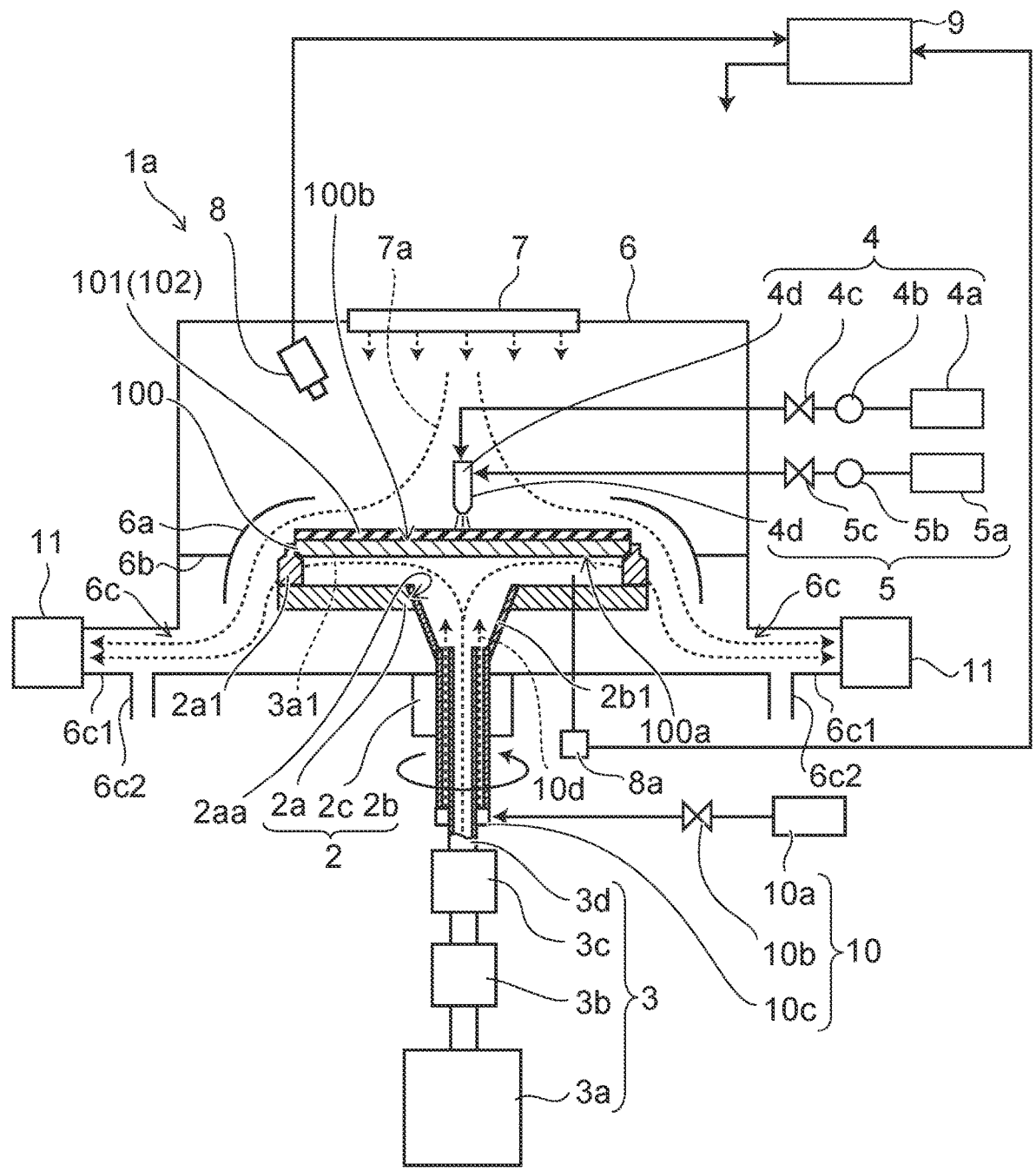
FIG. 6 is a schematic view for illustrating a substrate treatment device according to another embodiment.

FIG. 6 is a schematic view for illustrating the substrate treatment device 1a according to another embodiment.

As shown in FIG. 6, a substrate treatment device is includes the placement 2, the cooling part 3, the a first liquid supplier 4, the second liquid supplier 5, the housing 6, the blower part 7, the detector 8, and a temperature detector 8a, a gas supplier 10, the exhaust part 11, and the controller 9.

The temperature detector 8a detects the temperature of the space between the substrate 100 and the placement stand 2a. This temperature is substantially equal to the temperature of the mixed gas (gas in which the cooling gas 3a1 and the gas 10d are mixed) flowing between the substrate 100 and the placement stand 2a. The temperature detector 8a can be, for example, a radiation thermometer, a thermoviewer, a thermocouple, a resistance temperature detector, or the like.

The gas supplier 10 includes a gas storage part 10a, a flow rate controller 10b, and a connection part 10c.

The gas storage part 10a stores and supplies the gas 10d. The gas storage part 10a can be a high-pressure cylinder or factory piping in which the gas 10d is stored.

The flow rate controller 10b controls the flow rate of the gas 10d. The flow rate controller 10b can be, for example, an MFC that directly controls the flow rate of the gas 10d, or an APC that indirectly controls the flow rate of the gas 10d by controlling the pressure.

The connecting part 10c is connected to the rotating shaft 2b. The connection part 10c connects the flow rate controller 10b and the space between the rotating shaft 2b and the cooling nozzle 3d. The connecting part 10c can be, for example, a rotary joint.

The gas 10d is not particularly limited as long as it is a gas that does not easily react with the material of the substrate 100. The gas 10d can be, for example, an inert gas such as nitrogen gas, helium gas, or argon gas. In this case, the gas 10d can be the same gas as the cooling gas 3a1. However, the temperature of the gas 10d is higher than the temperature of the cooling gas 3a1. The temperature of the gas 10d can be, for example, room temperature.

If the cooling rate of the liquid 101 becomes too high, the liquid 101 will not be in a supercooled state and will freeze immediately. That is, the supercooling process cannot be performed. In this case, the cooling rate of the liquid 101 can be controlled by at least one of the rotation speed of the substrate 100 and the flow rate of the cooling gas 3a1. However, the temperature of the cooling gas 3a1 becomes substantially constant depending on the temperature setting in the cooling part that supplies the cooling gas 3a1. Therefore, it may be difficult to decrease the cooling rate of the liquid 101 at the flow rate of the cooling gas 3a1.

Further, if the rotation speed of the substrate 100 is reduced, the thickness of the liquid film becomes thicker, so that the cooling rate can be deceased. However, since the thickness of the liquid film has a limit thickness that can be maintained by surface tension, it may be difficult to decrease the cooling rate of the liquid 101 at the rotation speed of the substrate 100.

Therefore, in the embodiment, the cooling rate of the liquid 101 can be decreased by mixing the gas 10d having a temperature higher than that of the cooling gas 3a1 and the cooling gas 3a1. The cooling rate of the liquid 101 can be controlled by the flow rate of the gas 10d and the cooling gas 3a1, the mixing ratio of the gas 10d and the cooling gas 3a1, the temperature of the gas 10d, and the like.

By mixing the cooling gas 3a1 with the gas 10d having a temperature higher than that of the cooling gas 3a1, the temperature of the gas supplied to the space between the substrate 100 and the placement stand 2a can be adjusted more precisely. Therefore, the cooling temperature of the substrate 100 can be adjusted with higher accuracy. Moreover, the supercooled state of the liquid 101 can be controlled more easily.

The liquid 101 in the supercooled state has a property of starting freezing starting from a contamination, and the volume expansion coefficient due to the phase change is larger than that of the liquid 101 frozen without undergoing supercooling. The above-mentioned properties correlate with the ratio of the liquid change into the solid, and the lower the freezing start temperature, the higher the ratio of the freezing starting from the contamination. The volume expansion coefficient due to the phase change is the highest value when the freezing start temperature is in the range of −20° C. to −35° C. From these facts, it is preferable that the freezing start temperature is as low as possible, for example, −20° C. or lower.

As described above, by mixing the cooling gas 3a1 with the gas 10d having a temperature higher than that of the cooling gas 3a1, the probability that the supercooled liquid 101 can be cooled to −20° C. or lower can be increased. As a result, a high removal ratio can be obtained in the freezing process (solid-liquid phase). In addition, the removal ratio up to the freezing process (solid-liquid phase) in each freeze-cleaning process becomes more stable. As a result, the removal ratio of each substrate 100 is stable, and the yield is improved. Therefore, the removal ratio of contaminations is improved.

Further, if the gas supplier 10 is provided, the cooling rate in the freezing process (solid-liquid phase) of the cooling process can be adjusted so that the temperature T at the start of freezing described above is not lower than −40° C. and not higher than −20° C.

Further, even if the detector 8 detects the temperature of the liquid film and controls the flow rate of the cooling gas 3a1, the temperature on the front surface 100b side of the substrate 100 (the temperature of the liquid film) and the temperature on the back surface 100a side of the substrate 100 may be different. Therefore, if the flow rate of the cooling gas 3a1 is controlled only based on the temperature of the liquid film detected by the detector 8, even if the temperature of the liquid film becomes an appropriate temperature, the temperature of the liquid film and the temperature of the back surface 100a of the substrate 100 may be different, and the temperature gradient in the thickness direction of the substrate 100 may become large. When the temperature gradient in the thickness direction of the substrate 100 becomes large, the density change due to the non-uniform temperature may be the starting point of freezing, and therefore the freezing timing may vary for every substrate 100.

Further, when the temperature gradient becomes large, the density variation is likely to occur, and it is considered that the change in density due to the density variation becomes the starting point of freezing. Therefore, the freezing timing may vary even within the plane of the substrate 100.

According to the embodiment, the controller 9 can control at least one of the flow rate of the gas 10d and the cooling gas 3a1 and the mixing ratio of the gas 10d and the cooling gas 3a1 based on the temperature measured by the temperature detector 8a.

Therefore, the controller 9 performs such control in the preliminary process, and can switch from the preliminary process to the supercooling process (stopping the supply of the liquid 101) after the difference between the temperature detected by the detector 8 and the temperature detected by the temperature detector 8a is within a predetermined range. By doing so, freezing can be started in a state where the temperature gradient in the thickness direction of the substrate 100 is small, so that it is possible to suppress variations in the freezing timing.

It is also possible to control the supercooled state of the liquid 101 by controlling the flow rate of the gas 10d supplied from the gas supplier 10 without controlling the flow rate of the cooling gas 3a1 (the flow rate of the cooling gas 3a1 is kept constant) by the flow rate controller 3c. In such a case, the flow rate controller 3c can be omitted. However, if the flow rate controller 3c and the gas supplier 10 are provided, the supercooled state of the liquid 101 can be controlled more easily.

Further, the supercooled state of the liquid 101 can also be controlled by controlling the amount of air 7a supplied by the blower part 7.

Further, the supply of the gas 10d from the gas supplier 10 may be stopped in the freezing process (solid phase) based on the temperature detected by the detector 8. For example, when the liquid 101 is completely frozen, the temperature rise due to latent heat disappears, so that the temperature of the frozen liquid 101 begins to decrease again. By detecting this temperature drop by the temperature detector 8, it is determined that the liquid 101 is completely frozen, and the supply of the gas 10d from the gas supplier 10 may be stopped.

By doing so, the time of the freezing process (solid phase), that is, the time until cracking can be shortened.

The embodiments have been described. However, the invention is not limited to these embodiments. For example, any addition, deletion, or design change of components, or any addition, omission, or condition change of processes in the above embodiments suitably made by those skilled in the art are also encompassed within the scope of the invention as long as they fall within the spirit of the invention.

For example, the shape, size, number, arrangement, and the like of each component included in the substrate treatment device 1 are not limited to those illustrated, and can be appropriately changed.

Further, cooling may be continued under a predetermined condition for a predetermined time from the start time of the freezing process (solid-liquid phase) and the freezing process (solid phase). For example, the start time of the freezing process (solid-liquid phase) can be obtained by detecting the time when the temperature of the liquid 101 in the supercooled state suddenly rises by the detector 8. Further, the start time of the freezing process (solid phase) can be obtained by detecting the time when the temperature of the liquid 101 starts to decrease from the state maintained at the temperature near the freezing point by the detector 8.

If the detector 8 can detect the start times of the freezing process (solid-liquid phase) and the freezing process (solid phase) in this way, the presence or absence of cracks can be determined from the results obtained by analyzing or calculating the data of the detector 8. It is not necessary to attach the determination function to the substrate treatment device 1. That is, it can be a simple controller 9.

Further, the crack may be detected by the reflectance. When cracks occur, the frozen film is separated from the substrate, so that the reflectance changes. It is judged that the ice has sufficiently peeled off due to this change in reflectance, and thawing is started.

In this way, by detecting cracks based on the reflectance, it is possible to reliably detect cracks that cannot be detected from temperature changes. As a result, particles can be removed more reliably.

Further, according to the inventor's knowledge, cracks occur at −50° C. or lower. Therefore, −50° C. can be set as the threshold value. If the temperature of the frozen film below this threshold value, it may be considered that cracks have occurred and thawing may be started.

By doing so, the reflectance, the refractive index, and the mechanism for capturing an image can be eliminated, and a simple configuration can be obtained. The defrosting may be started after about 0.2 to 2.0 seconds have passed since the threshold value was reached.

Further, the processed surface of the substrate 100 may be imaged and cracks may be observed from the captured image. For example, the captured image is processed to detect a predetermined crack state (number, area). Since the cracks look like white streaks, the image is binarized in black and white to detect the cracks. Then, when the number of cracks or the area of the cracks exceeds the threshold value, it is determined that the ice has sufficiently peeled off, and thawing may be started.

By doing this, the occurrence of cracks is directly detected, so particles can be removed more reliably.

What is claimed is:

1. A substrate treatment device, comprising:
a placement stand configured to rotate a substrate;
a cooling part configured to supply a cooling gas into a space between the placement stand and the substrate;
a liquid supplier configured to supply a liquid on a surface of the substrate opposite to the placement stand; and
a controller controlling a rotation speed of the substrate, a flow rate of the cooling gas, or a supply amount of the liquid,
the controller setting the liquid on the surface of the substrate to be in a supercooled state, forming a frozen film by freezing the liquid in the super cooled state, and causing crack to generate in the frozen film by decreasing a temperature of the frozen film.

2. The device according to claim 1, wherein
the controller repetitively performs processes causing the crack to generate in the frozen film, and
when number of the repetitions is 20 times or more, the controller controls the supply amount of the liquid to set a thickness of a liquid film of the liquid on the surface of the substrate to be not less than 300 μm and not more than 1200 μm.

3. The device according to claim 2, wherein
the controller sets the rotation speed of the substrate to be 50 rpm or less.

4. The device according to claim 1, wherein
the controller repetitively performs processes causing the crack to generate in the frozen film, and
when number of the repetitions is 10 times or more, the controller controls the supply amount of the liquid to set a thickness of a liquid film of the liquid on the surface of the substrate to be not less than 600 μm and not more than 1200 μm.

5. The device according to claim 4, wherein
the controller sets the rotation speed of the substrate to be 50 rpm or less.

6. The device according to claim 1, wherein
the controller repetitively performs processes causing the crack to generate in the frozen film, and
when number of the repetitions is 5 times or more, the controller controls the supply amount of the liquid to set a thickness of a liquid film of the liquid on the surface of the substrate to be not less than 1000 μm and not more than 1200 μm.

7. The device according to claim 6, wherein
the controller sets the rotation speed of the substrate to be 50 rpm or less.

8. The device according to claim 1, wherein
the controller
controls the liquid supplier to supply the liquid at a higher temperature than a freezing point on an opposite surface to the placement stand side of the substrate, and maintains such a state until a predetermined time has elapsed after supplying the cooling gas on a surface on the placement stand side of the substrate by controlling the cooling part,
after the predetermined time has elapsed, changes to a second rotation speed at which a thickness of the liquid film becomes a predetermined thickness by controlling the placement stand,
after changing to the second rotation speed, stops supply of the liquid by controlling the liquid supplier while maintaining supply of the cooling gas by controlling the cooling part,
after stopping the supply of the liquid, rotates the substrate at the second rotation speed during time until the thickness of the liquid film becomes the predetermined thickness, and
after the thickness of the liquid film becomes the predetermined thickness, the controller stops the rotation of the substrate by controlling the placement stand, or sets a first rotation speed which is a rotation speed slower than the second rotation speed.

9. The device according to claim 8, wherein
the first rotation speed is 50 rpm or less.

10. The device according to claim 8, wherein
the second rotation speed is not less than 50 rpm and not more than 100 rpm.

11. The device according to claim 1, further comprising:
a detector configured to detect the crack.

12. The device according to claim 11, wherein
the detector
detects a temperature of the liquid on the surface of the substrate, and
the controller
detects time when the liquid film becomes the frozen film from the temperature detected by the detector, and thaws the frozen film after a predetermined time has elapsed from the detected time.

13. The device according to claim 11, wherein
the detector
detects a temperature of the liquid on the surface of the substrate, and
the controller
stores in advance a temperature at which the crack is generated in the frozen film, and
thaws the frozen film when the temperature detected by the detector reaches the temperature at which the crack is generated.

14. The device according to claim 13, wherein
the temperature at which the crack is generated is −50° C. or lower.

15. The device according to claim 11, wherein
the detector
images the surface of the substrate, and
the controller
stores in advance number of the cracks or area of the crack as a threshold value,
detects the cracks from an image imaged by the detector, and thaws the frozen film when the number of the cracks or the area of the cracks is the threshold value or more.

16. The device according to claim 15, wherein
the controller detects the cracks by binarizing the image imaged by the detector.

17. The device according to claim 11, wherein
the detector
detects a surface position of the frozen film, and
the controller stores in advance the surface position where the cracks are generated in the frozen film, and thaws the frozen film when the surface position detected by the detector reaches the surface position where the cracks are generated.

18. The device according to claim 11, wherein the detector detects reflectance of the frozen film, the controller stores in advance reflectance at which the cracks are generated in the frozen film, and thaws the frozen film when the reflectance detected by the detector reaches the reflectance at which the cracks are generated.

19. The device according to claim 2, wherein the liquid is water or liquid including water as a main component, the controller controls the liquid supplier to supply the liquid at a higher temperature than a freezing point on an opposite surface to the placement stand side of the substrate, and maintains such a state until a predetermined time has elapsed after supplying the cooling gas on a surface on the placement stand side of the substrate by controlling the cooling part, after the predetermined time has elapsed, changes to a second rotation speed at which a thickness of the liquid film becomes a predetermined thickness by controlling the placement stand, after changing to the second rotation speed, stops supply of the liquid by controlling the liquid supplier while maintaining supply of the cooling gas by controlling the cooling part, after stopping the supply of the liquid, rotates the substrate at the second rotation speed during time until the thickness of the liquid film becomes the predetermined thickness, and after the thickness of the liquid film becomes the predetermined thickness, the controller stops the rotation of the substrate by controlling the placement stand, or sets a first rotation speed which is a rotation speed slower than the second rotation speed.

20. The device according to claim 19, wherein the first rotation speed is 50 rpm or less.

* * * * *

UNITED STATES PATENT AND TRADEMARK OFFICE
CERTIFICATE OF CORRECTION

PATENT NO. : 11,784,040 B2
APPLICATION NO. : 17/181264
DATED : October 10, 2023
INVENTOR(S) : Kensuke Demura et al.

It is certified that error appears in the above-identified patent and that said Letters Patent is hereby corrected as shown below:

In the Specification

Column 9, Line 10, "about 0.1 L/min to LO" should be --about 0.1 L/min to 1.0--

Signed and Sealed this
Fourteenth Day of May, 2024

Katherine Kelly Vidal
*Director of the United States Patent and Trademark Office*